(12) United States Patent
Fairbanks

(10) Patent No.: US 7,554,374 B2
(45) Date of Patent: Jun. 30, 2009

(54) BOUNDING A DUTY CYCLE USING A C-ELEMENT

(75) Inventor: Scott M. Fairbanks, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 61 days.

(21) Appl. No.: 11/694,440

(22) Filed: Mar. 30, 2007

(65) Prior Publication Data

US 2008/0238509 A1 Oct. 2, 2008

(51) Int. Cl.
*H03K 3/017* (2006.01)

(52) U.S. Cl. .................................. 327/175
(58) Field of Classification Search ............ 327/172, 327/175, 176
See application file for complete search history.

(56) References Cited

U.S. PATENT DOCUMENTS

| | | | | |
|---|---|---|---|---|
| 5,646,554 A | * | 7/1997 | Kim et al. | 326/93 |
| 5,760,610 A | * | 6/1998 | Naffziger | 326/93 |
| 5,918,042 A | * | 6/1999 | Furber | 713/600 |
| 6,281,707 B1 | * | 8/2001 | Fairbanks | 326/83 |
| 6,407,602 B1 | * | 6/2002 | Radjassamy | 327/170 |
| 6,426,652 B1 | * | 7/2002 | Greenhill et al. | 326/83 |
| 6,469,563 B2 | * | 10/2002 | Heyne et al. | 327/362 |
| 6,486,700 B1 | * | 11/2002 | Fairbanks et al. | 326/36 |
| 6,654,944 B1 | * | 11/2003 | Dike | 716/17 |
| 6,809,570 B2 | * | 10/2004 | Francom | 327/178 |
| 6,982,581 B2 | | 1/2006 | Dosho et al. | |
| 7,019,574 B2 | | 3/2006 | Schrödinger | |
| 7,205,814 B2 | * | 4/2007 | Park | 327/291 |
| 7,304,517 B2 | * | 12/2007 | Kim et al. | 327/175 |

OTHER PUBLICATIONS

Dally et al., "Digital Systems Engineering", Cambridge University Press, pp. 588-607, Jun. 28, 1998.

* cited by examiner

*Primary Examiner*—Jeffrey S Zweizig
(74) *Attorney, Agent, or Firm*—Dorsey & Whitney LLP

(57) ABSTRACT

A duty cycle bounding circuit for restoring the unbounded duty cycle of a periodic signal such as a forwarded clock signal. The duty cycle bounding circuit comprises a state holding logic element, such as a C-element, and a delay line. The delay line feeds back an inverted version of the output of the state holding logic element to an input of the state holding logic element. The periodic signal is applied to another input of the state holding logic element.

19 Claims, 5 Drawing Sheets

One-stage C-element

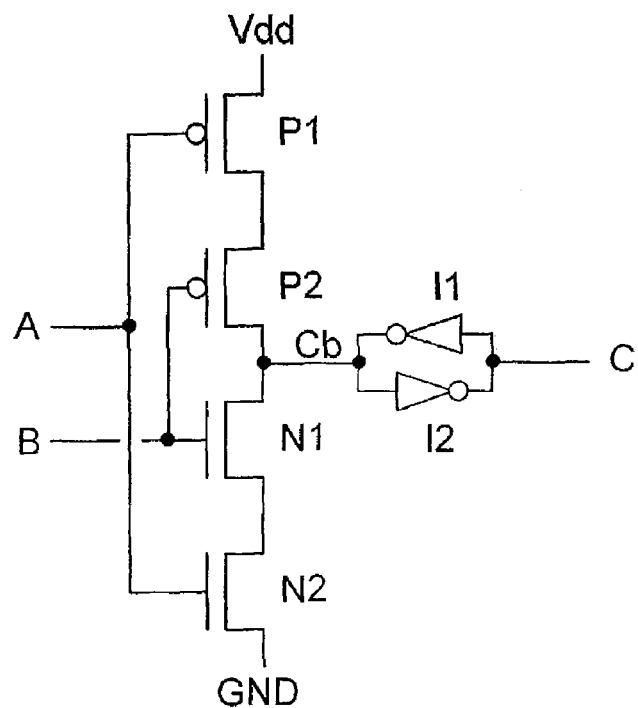
One-stage C-element
FIG. 1A
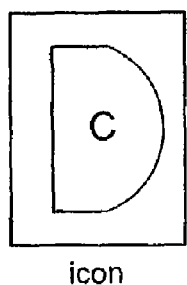
icon
FIG. 1B
| A | B | C |
|---|---|---|
| 0 | 0 | 0 |
| 0 | 1 | C' |
| 1 | 0 | C' |
| 1 | 1 | 1 |
Truth Table
FIG. 1C Two-stage C-element

BOUNDING A DUTY CYCLE USING A C-ELEMENT

FIELD OF THE INVENTION

Aspects of the present invention relate to circuits for processing a periodic signal such as a clock signal in a digital circuit. One particular aspect of the present invention relates to circuit techniques to produce a signal with a duty cycle whose deviation from fifty percent is bounded, given a periodic input signal whose duty cycle is not bounded.

BACKGROUND

In digital circuits, clock signals may be propagated across an integrated circuit and/or forwarded to one or more other integrated circuits. The clock signal is generally used to synchronize various operations within an integrated circuit or among multiple integrated circuits. Generally, the clock signal should have a fifty percent duty cycle. However, during signal propagation, the duty cycle can change due to propagation delays, capacitive loading, etc.

Even at lower clock frequencies, deviation from a fifty percent duty cycle may reduce timing margins of a circuit but often may be ignored without impacting proper integrated circuit operation. However, as timing margins are reduced to increase clock frequency and circuit performance, deviation from a fifty percent duty cycle may be hazardous. At very high frequencies, deviations in duty cycle may cause timing constraint violations and errors that result in improper circuit operation. Further, the duty cycle of a forwarded clock can deviate from its nominal fifty percent duty cycle due to jitter or systematic skew. Jitter may be caused by components with data-dependent power supply droop or from noise introduced into the signal. Skew may be caused by device mismatch, among other things. Therefore, what is needed is a circuit that produces a signal with a duty cycle whose deviation from fifty percent is bounded.

SUMMARY

One aspect of the present invention involves a duty cycle bounding circuit. The circuit includes a state holding logic element having at least two inputs and a delay element coupled from the output of the state holding logic element to a first input of the state holding logic element. The circuit further includes an inversion element configured to invert the output of the state holding logic element. The circuit temporally separates a second transition on the output of the state holding logic element relative to a first transition on the output by about the delay of the state holding logic element plus the delay of the delay element. The state holding logic element may include a C-element.

Another aspect of the present invention involves a method for bounding the duty cycle of a periodic signal with a period T and an unbounded duty cycle of D. The method involves receiving the periodic signal and applying the periodic signal to a first input of a state holding logic element having a delay. The method further involves providing an inverted output of the state holding logic element to a second input of the state holding logic element using an inverting delay element such that the sum of the delay of the state holding logic element plus the delay of the inverting delay element is less than half of T. The method finally involves bounding the periodic signal such that a second transition on the output of the state holding logic element relative to a first transition on the output is temporally separated by about the delay of the delay element plus the delay of the state holding logic element.

BRIEF DESCRIPTION OF THE DRAWINGS

FIGS. 1A-1C depict a circuit diagram of a one-stage C-element, an icon of a C-element as used in a circuit schematic and a C-element truth table.

DETAILED DESCRIPTION OF EMBODIMENTS OF THE INVENTION

One embodiment of the present invention involves a circuit that produces an output signal whose deviation from a fifty percent duty cycle is bounded, given a periodic input signal whose duty cycle is not bounded. Such a circuit may be used to recover forwarded clock signals and produce a recovered clock signal with a duty cycle whose variation from fifty percent is bounded.

As integrated circuits become increasingly more complex and operate at higher frequencies, variations in the duty cycle of periodic signals, e.g., a clock signal, can result in improper operation. The duty cycle D of a periodic signal of period T is generally defined as the ratio of the duration that the signal is a logic one in a period, $\tau$, to the total period. This may be expressed mathematically as:

$D=\tau/T$.

Thus, in a clock signal with a 10 ns period T and a logic one duration of 5 ns $\tau$, the duty cycle D is 50%.

When a clock signal is forwarded to another integrated circuit, the duty cycle of the clock may be reduced due to jitter, skew, or other reasons. Jitter refers to timing deviations from a signal characteristic due to time varying components such as data-dependent power supply droop or environmental noise. Whereas, skew refers to deviations from a signal characteristic due to static causes such as transistor mismatch. If the clock is forwarded multiple times, the duty cycle may be reduced from some value, say 50%, to a lesser value, say 25%. Such a reduction may result in circuit operation degradation or complete malfunction. Thus, for example, a periodic signal, such as a clock signal, input to a circuit conforming to aspects of the invention may have a duty cycle that has been degraded to 25%, but the circuit output produces a bounded and restored periodic signal with a duty cycle of about 50%. The forwarded clock signal has an unbounded duty cycle, meaning that its duty cycle can vary substantially from fifty percent.

Figure 2:
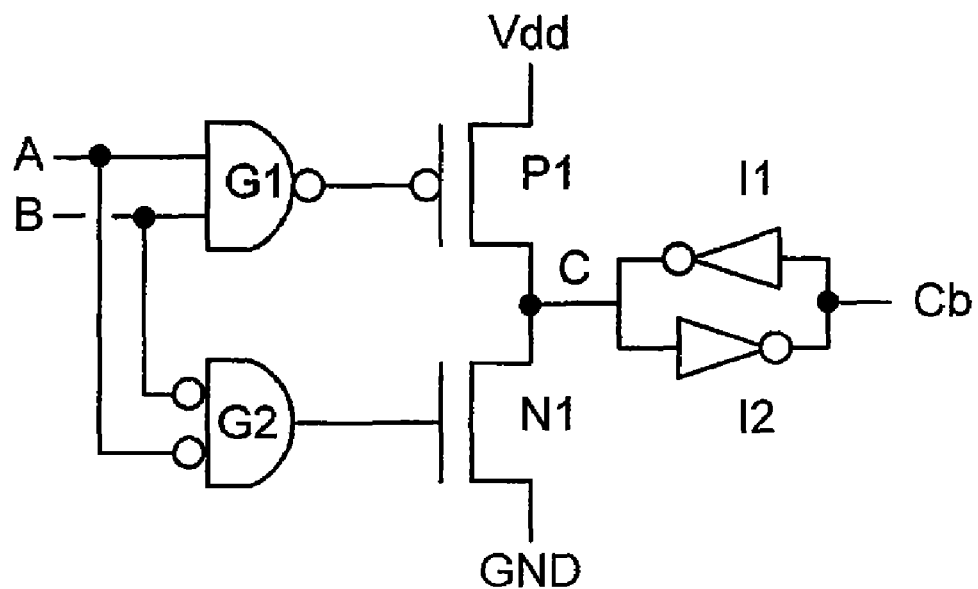
FIG. 2 depicts a circuit diagram of a two-stage C-element.

FIGS. 1A-1C depict a circuit diagram of a one stage C-element, an icon of a C-element as used in a circuit schematic, and a C-element truth table. FIG. 2 depicts a circuit diagram of a two-stage C-element. A C-element is a state holding logic element that may have two or more inputs and an output. As reflected in the two input C-element truth table of FIG. 1C, the output of a C-element reflects the inputs when the states of the inputs agree, otherwise the output value is held. Thus, a C-element will not transition to the opposite state until all the inputs transition to the other state. That is, when all inputs are a logic zero, the output is a logic zero and when all the inputs are a logic one, the output is a logic one. The output will not transition from a logic one to a logic zero (or from a logic zero to a logic one) until the inputs are at a logic zero state (or at a logic one state).

The operation of a one stage C-element, as depicted in FIG. 1A, will now be described. The one-stage C-element has two inputs, A and B, and an output C. The C-element has two p-channel transistors, P1 and P2, with a drain of P1 connected to a source of P2. The C-element also has two n-channel transistors, N1 and N2, with a source of N1 connected to a drain of N2. The C-element also has a pair of cross coupled inverters (a keeper), I1 and I2, with an input to the keeper being connected to the drains of P2 and N1. Input A is connected to the gates of P1 and N2. Input B is connected to the gates of P2 and N1. When input A is high and input B is low, N2 is conducting, P1 is off, N1 is off and P2 is on resulting in C (and Cb) being held by the back-to-back staticizing inverters I1 and I2. Similarly, when input A is low and input B is high, N1 is conducting, P2 is off, N2 is off and P1 is conducting resulting in C being held by the back-to-back staticizing inverters I1 and I2. Thus, when the inputs of the C-element differ in value, the output of the C-element is tri-stated, i.e., the conduction path between the supply, Vdd, and the output and the conduction path between the ground, GND, and the output are broken and the staticizing or keeper inverters I1 and I2 maintain the output. When inputs A and B are both low, N1 and N2 are off and P1 and P2 are conducting. This causes Cb to be driven high which results in C being driven low. Similarly, when inputs A and B are both high, N1 and N2 are both conducting and P1 and P2 are off. This causes Cb to be driven low which results in C being driven high.

The operation of a two stage C-element, as depicted in FIG. 2, will now be described. The two-stage C-element has two inputs, A and B, and an output C. The two-stage C-element has a NAND gate, G1, and an AND gate with inverting inputs, G2. Note that in other C-element implementations, G2 may be a NOR gate, which is logically equivalent to a NAND gate with inverting inputs. The two-stage C-element also has an inverter with a p-channel transistor, P1, with the gate connected to the output of G1, and a n-channel transistor, N1, with the gate connected to the output of G2. The two-stage C-element also has a pair of cross coupled inverters (a keeper), I1 and I2, with an input to the keeper connected to the drains of P1 and N1. Inputs A and B are connected to the inputs of G1 and G2. When input A is high and input B is low, N1 is off (output of G2 is low) and P1 is off (output of G1 is high), resulting in C (and Cb) being held by the back-to-back staticizing inverters I1 and I2. Similarly, when Input A is low and input B is high, N1 and P1 are off, resulting in C being held by the staticizing inverters I1 and I2. Thus, when the inputs of the two-stage C-element differ in value, the output of the two-stage C-element is tri-stated, i.e., the conduction path between the supply, Vdd, and the output and the conduction path between the ground, GND, and the output are broken and the staticizing or keeper inverters I1 and I2 maintain the output. When inputs A and B are both low, N1 is on (output of G2 is high) and P1 is off (output of G1 is high). This causes C to be driven low which results in Cb being driven high. Similarly, when inputs A and B are both high, N1 is off (output of G2 is low) and P1 is on (output of G1 is low). This causes C to be driven high which results in Cb being driven low.

For either the one-stage or two-stage C-element, each transition on input A is paired with a transition on input B. The transition on input A may occur earlier or later than the transition on input B.

While two specific implementations of a C-element have been described, other implementations of a C-element have not been shown for purposes of clarity. As such, specific implementations of a C-element are for purposes of illustration only. Other implementations of a C-element may be used by various embodiments of the present invention including a C-element implemented with NAND gates and inverters.

Figure 3:
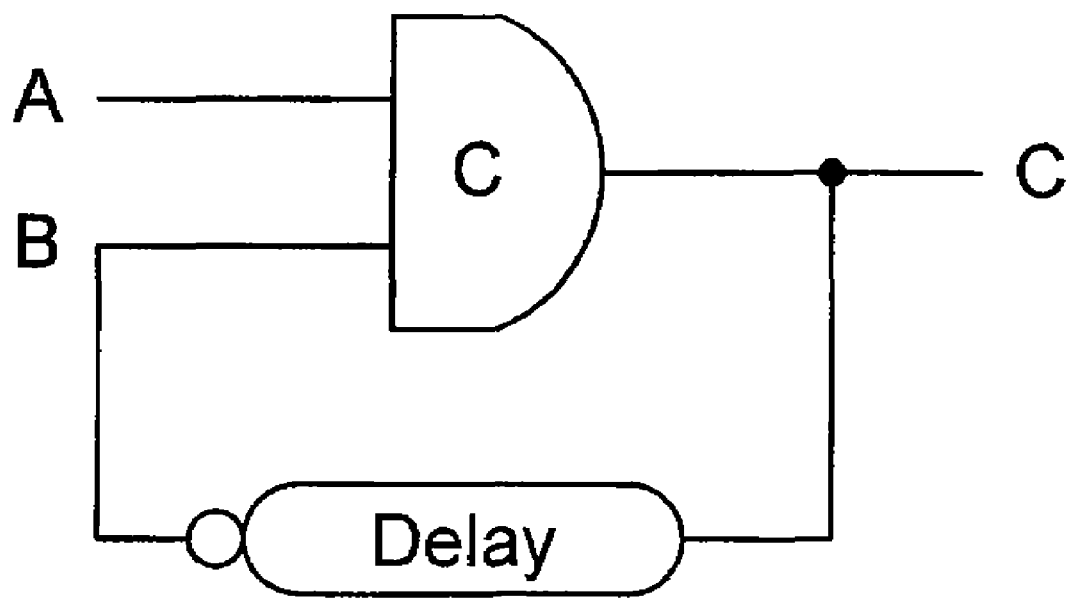
FIG. 3 depicts a duty cycle bounding circuit of one embodiment of the present invention.

FIG. 3 depicts the circuit diagram of a circuit employed by one embodiment of the present invention to bound the duty cycle of the output signal, given a periodic input signal that is not duty cycle bounded. The circuit contains a C-element and an inverting delay line. Other embodiments may use an inverting C-element and a non-inverting delay line. Yet, other embodiments may use a C-element having differential inputs and/or a differential output. The delay element is operatively coupled from the output of the C-element to one of the inputs. The other input to the C-element is operatively coupled to a periodic signal of some duty cycle. In some embodiments, the delay element may have a fixed delay while in other embodiments, the delay may be adjustable.

The circuit depicted in FIG. 3 bounds the deviation of the output signal duty cycle from a balanced fifty percent duty cycle. Two transitions on the output are generally temporally separated ($t_{sep}$) by at least the delay of the C-element plus the delay of the delay line, which may be expressed mathematically as:

$t_{sep} = d_{Cele} + d_{delay}$; where $d_{Cele}$ is the delay of the C-element and $d_{Cele}$ is the delay introduced by the delay line.

The circuit bounds the duty cycle of the signal at the output of the C-element, which may be expressed mathematically as:

$100\% * t_{sep}/T < D < 100\% * (T - t_{sep})/T$; where D is the duty cycle of the output signal and T is the period of the input signal.

For example, if T is 1 μs and $t_{sep}$ is 400 ns, then the duty cycle D of the output signal is bounded to lie between 40% and 60%.

Figure 4:
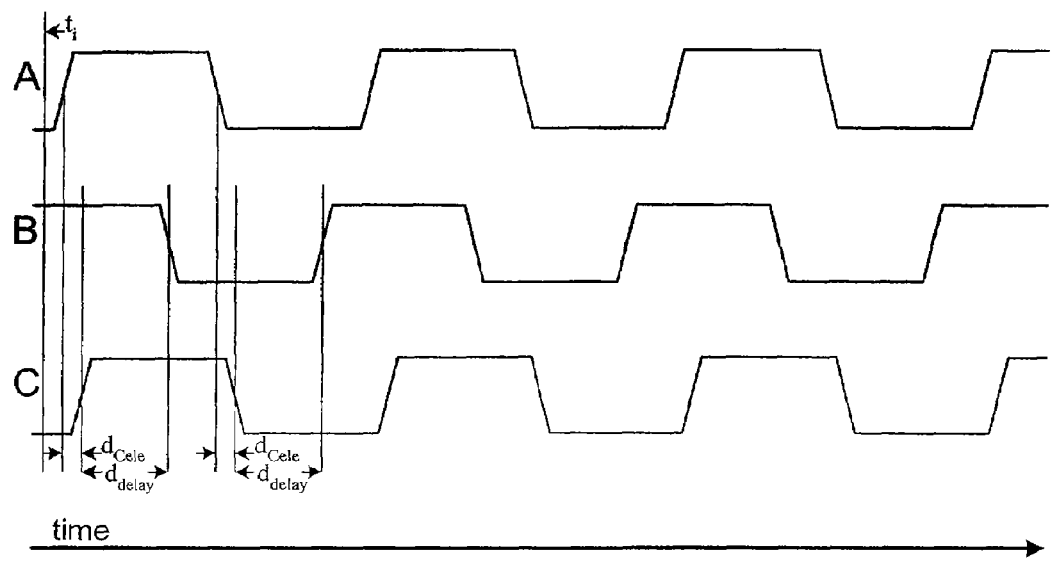
FIG. 4 depicts a timing diagram of the duty cycle bounding circuit of FIG. 3 when a periodic signal with a duty cycle of about 50% is applied to input A.

FIG. 4 depicts the timing diagram of the circuit depicted in FIG. 3 when a periodic signal with a duty cycle of about 50% is applied to input A. A clock signal with a 50% duty cycle has little or no error; thus, the circuit does not significantly correct the duty cycle of the input signal. Timing diagram A represents an unbounded periodic signal on input A of the circuit, timing diagram B represents the signal on input B of the circuit, and timing diagram C represents the output of the circuit. The delay element has a delay of $d_{delay}$ and the C-element has a delay of $d_{Cele}$. The binary value at the output of the C-element and the value on input A at time $t_i$ are initially the same, a logic zero. Note that in general, the output of the C-element will initialize to the state of input A when input A is held constant (without the need for any additional initialization circuitry). Thus, at time $t_i$, input B is initially high. Recall, B is a delayed and inverted version of output C. At this point, the C-element output is held (the inputs are different). As FIG. 4 depicts, when input A goes high, the output C will go high after a delay of about $d_{Cele}$. Input B then goes low after a delay of about $d_{delay}$. As FIG. 4 depicts, when the feedback output arrives at input B before the next transition occurs on input A, the C-element produces its next transition in response to the transition on input A, which is when A goes low because B is already low. In this situation, the duty cycle bounding circuit provides no correction to the duty cycle of the input signal. As shown in FIG. 4, when the feedback output signal always arrives at input B before a next transition on input A, the output C is a delayed copy (by about $d_{Cele}$) of the input signal.

Figure 5:
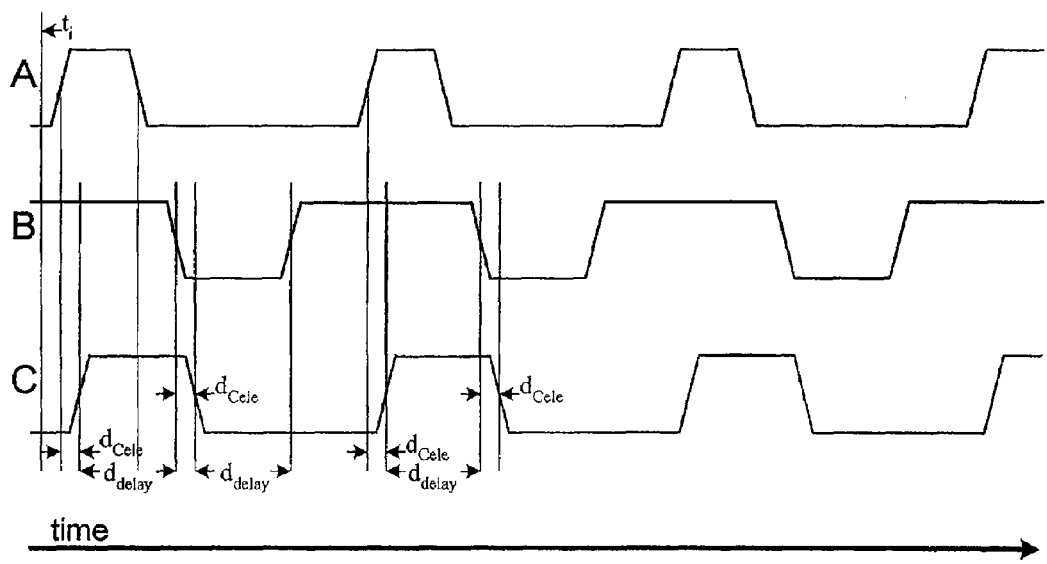
FIG. 5 depicts a timing diagram of the duty cycle bounding circuit of FIG. 3 when a periodic signal with a duty cycle of about 25% is applied in input A.

FIG. 5 illustrates a timing diagram of the circuit depicted in FIG. 3 where the input signal A has a duty cycle of about 25%, which is less than $100\%*t_{sep}/T$. This causes the circuit to increase the duty cycle of the input signal by delaying the high to low transition on the output. Initially, at time $t_i$, the binary value at the output of the C-element and the value on input A are the same, a logic zero, and input B is at a logic high. The C-element output is held low. When input A goes high, the output C will go high after a delay of about $d_{Cele}$. Then, input A goes low while input B is still high because the feedback output signal C has not arrived at input B through the delay line until after a delay of about $d_{delay}$. Thus, the output C is held high (the inputs of the C-element are different) and the output C is no longer a delayed copy of the input signal A. When input B goes low after a delay of about $d_{delay}$, output C goes low after a delay of about $d_{Cele}$. This causes input B to go high after a delay of about $d_{delay}$. The output is again held and the C-element is waiting for input A to go high. Thus, the second transition on the output is determined by when the transition on input B arrives. The transition at the output is delayed by about the difference in the arrival time of this second transition on the input A and the feedback signal on input B. The duty cycle bounding circuit ensures that two transitions on the output generally are not temporally located closer than $t_{sep}=d_{Cele}+d_{delay}$ (here it is the rising edge of C to the falling edge of C) That is, the circuit causes the output signal duty cycle to move closer to 50%. In general, when the input signal duty cycle is less than $100\%*t_{sep}/T$ the duty cycle bounding circuit operates to increase the output signal duty cycle to about $100\%*t_{sep}/T$.

Figure 6:
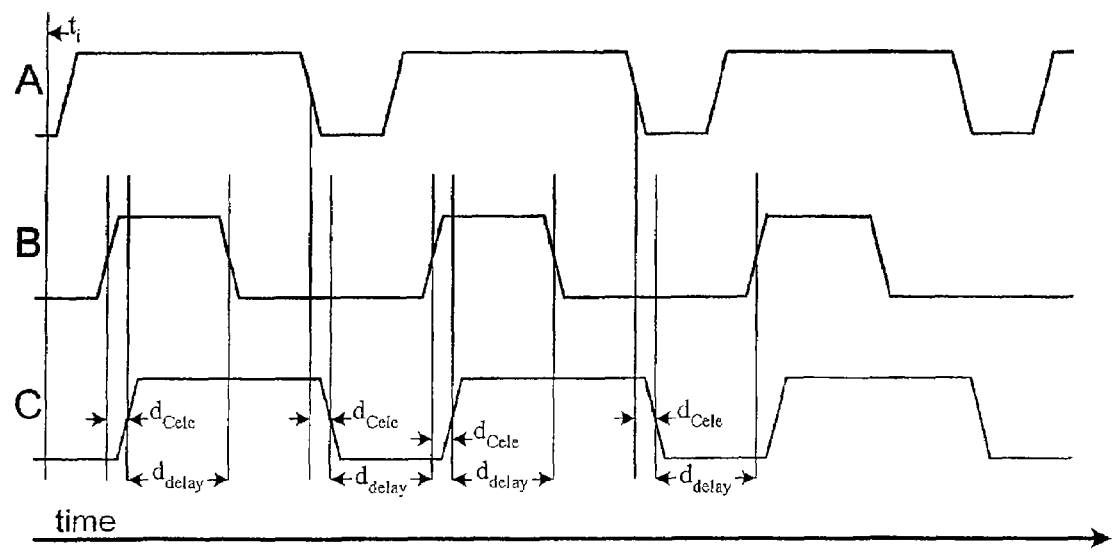
FIG. 6 depicts a timing diagram of the duty cycle bounding circuit of FIG. 3 when a periodic signal with a duty cycle of about 75% is applied in input A.

FIG. 6 depicts a timing diagram of the circuit depicted in FIG. 3 where the input signal A has a duty cycle of about 75%, which is greater than $100\%*t_{sep}/T$. This causes the circuit to decrease the duty cycle of the input signal by delaying the low to high transition on the output. Initially, at time $t_i$, input A, input B and output C are at a logic zero. When input A transitions high, output C is held low (the inputs of the C-element are different). Then when input B goes high (after a delay of about $d_{delay}$ when the feedback output C arrives at input B through the inverting delay line), output C will go high after a delay of about $d_{Cele}$. Then input B goes low after a delay of about $d_{delay}$ when the feedback output signal C arrives. The output C is held high because the inputs of the C-element are different. When input A transitions low, output C transitions low after a delay of about $d_{Cele}$. Then input B transitions high after a delay of about $d_{delay}$. In this situation input A goes high before input B and the output C is held low until input B goes high. Again, the transition on the output is determined by when the transition on input B arrives rather than by the transition on input A. The transition at the output is delayed by about the difference in the arrival time of the second transition on input A and the feedback signal on input B. The duty cycle bounding circuit again ensures that two transitions on the output generally are not temporally located closer than $t_{sep}=d_{Cele}+d_{delay}$ (here it is the falling edge of C to the rising edge of C). That is, the circuit causes the output signal duty cycle to move closer to 50%. In general, when the duty cycle of the input signal is greater than $100\%*(T-t_{sep})/T$ the duty cycle bounding circuit operates to decrease the output signal duty cycle to generally be about $100\%*(T-t_{sep})/T$.

As the timing diagrams of FIGS. 5 and 6 illustrate, the duty cycle bounding circuit depicted in FIG. 3 operates to increase or decrease the output signal duty cycle D, given an input signal of period T. The circuit generally bounds the duty cycle to be between $100\%*t_{sep}/T<D<100\%*(T-t_{sep})/T$. Thus, by setting $t_{sep}$ to about 48% the output signal duty cycle can be maintained close to 50%. This is especially useful when timing constraints are tight and the duty cycle of signals such as forwarded clocks need to be maintained.

For proper operation of the duty cycle bounding circuit, there are timing constraints that should be observed for both the delay line and the input duty cycle. It is possible to construct a circuit conforming to aspects of the invention without the constraints; however, the constraints may be advantageous in certain circumstances. The delay line has two timing constraints that should be observed. First, the delay line should be long enough so that the output can complete its transition. If the delay of the delay line is too short, then the output transition is arrested before completion.

The second constraint on the delay line is that the delay of the delay line plus the delay of the C-element generally should be less than half of the input signal period. Mathematically this may be expressed as:

$d_{Cele}+d_{delay}<T/2$; where T is the period of the input signal.

Figure 7:
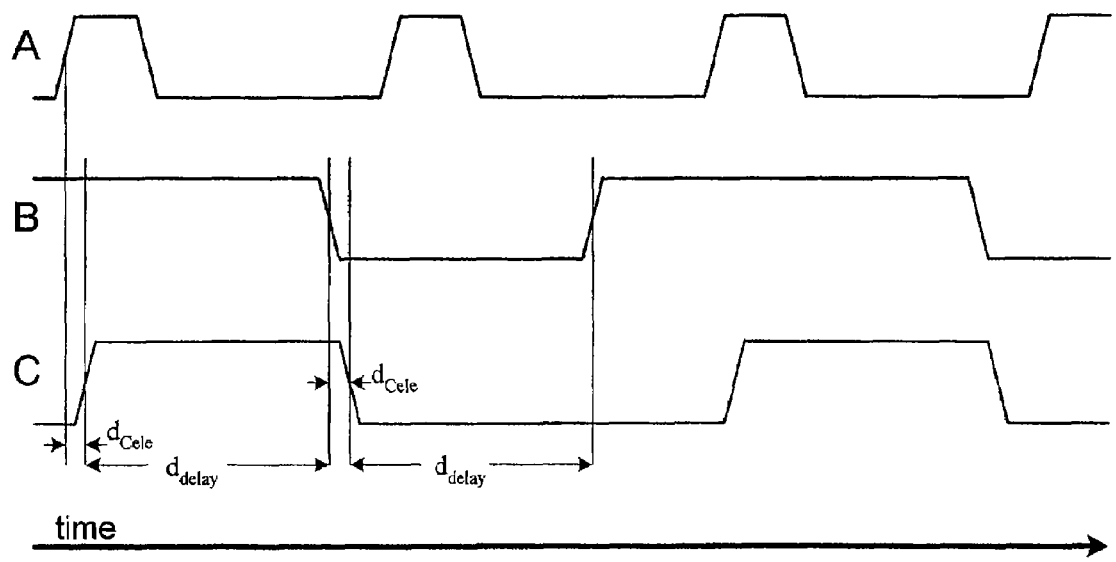
FIG. 7 depicts a timing diagram of the duty cycle bounding circuit of FIG. 3 when a periodic signal with a duty cycle of about 25% is applied in input A and the delay of the delay line is about 75% of the input signal period.

If the second constraint is not observed, then two successive input transitions might occur on input A without a single transition on input B. FIG. 7 illustrates this situation. In this situation $d_{delay}$ is about 75% of T. When input A goes high, the output goes high after a delay of $d_{Cele}$. Input B then goes low after a delay of $d_{delay}$, which causes the output to go low after a delay of $d_{Cele}$. When input A goes high, the output is held low because the C-element is waiting for input B to go high. Meanwhile, input A goes low and the output is still held low. In this situation, two transitions occur on input A before a single transition on input B resulting in two output transitions being skipped. That is, the output misses a pulse (two transitions) on input A.

More generally, two output transitions will be skipped after at most X input signal periods, where X may be expressed mathematically as:

$X=T/(2*t_{sep}-T)$.

For example, if $t_{sep}$ is 51% of the input signal period, then two output transitions will be skipped after at most 50 input signal periods.

The duty cycle of the input signal generally should not be too short, otherwise the duty cycle bounding circuit might fail to properly bound the duty cycle. When the duty cycle is very short, the input signal may be viewed as a short pulse. Because current C-elements have a limited bandwidth, they may filter the pulse out. The minimum pulse width (or minimum duty cycle of the periodic input signal) is generally determined by the fabrication process and circuit design. Generally, the two-stage C-element shown in FIG. 2 has a greater bandwidth than the one-stage C-element shown in FIG. 1A. Additionally, the two-stage C-element is capable of handling duty cycles that have a greater deviation from 50% than the one-stage C-element.

As will be recognized by those skilled in the art from the foregoing description of example embodiments of the invention, numerous variations of the described embodiments may be made without departing from the spirit and scope of the invention. For example, the duty cycle bounding circuit may employ fixed or variable delay elements, delay elements implemented using microstrip lines or an odd number of inverters connected in series, the state holding element may be a one-stage or two-stage C-element with either single ended or differential inputs and outputs. Further, while the present invention has been described in the context of specific embodiments and processes, such descriptions are by way of example and not limitation. Accordingly, the proper scope of the present invention is specified by the following claims and not by the preceding examples.

What is claimed is:

1. A duty cycle bounding circuit, comprising:
   a state holding logic element having at least two inputs and an output, the state holding element having a first delay;
   a delay element coupled from the output of the state holding logic element to a first one of the at least two inputs, the delay element having a second delay;
   a processor having a clock signal with an unbounded duty cycle, the clock signal coupled with a second one of the at least two inputs; and
   wherein a first transition on the output and a second transition on the output occur in response to the clock signal, further wherein an output duty cycle is different than the unbounded duty cycle on the second one of the at least two inputs;
   an inversion element configured to invert the output of the state holding logic element; and
   wherein the second transition on the output relative to the first transition on the output is temporally separated by about the delay of the delay element plus the delay of the state holding logic element and further wherein a sum of the first delay plus the second delay is less than half a period, T, of the clock signal.

2. The duty cycle bounding circuit of claim 1 wherein the state holding logic element comprises a C-element.

3. The duty cycle bounding circuit of claim 1 wherein the delay element comprises at least one inverter.

4. The duty cycle bounding circuit of claim 1 wherein the delay of the delay element plus the delay of the state holding logic element is equal to about forty-eight percent of the period of a periodic signal applied to a second one of the at least two inputs.

5. The duty cycle bounding circuit of claim 1 wherein the delay element has an adjustable delay.

6. The duty cycle bounding circuit of claim 2 wherein the C-element is selected from the group consisting of a one-stage C-element and a two-stage C-element.

7. The duty cycle bounding circuit of claim 1 wherein the state holding logic element comprises the inversion unit.

8. The duty cycle bounding circuit of claim 1 wherein the delay element comprises the inversion unit.

9. The duty cycle bounding circuit of claim 1 wherein the state holding logic element comprises a C-element having differential inputs.

10. The duty cycle bounding circuit of claim 9 wherein the C-element has a differential output.

11. The duty cycle bounding circuit of claim 1 wherein the duty cycle bounding circuit bounds a duty cycle, D, of the clock signal such that:
    $100\% * (\text{first delay} + \text{second delay})/T < D < 100\% * (T - \text{first delay} - \text{second delay})/T$.

12. A method for bounding the duty cycle of a periodic signal with a period T and an unbounded duty cycle of D, the method comprising:
    receiving the periodic signal with the unbounded duty cycle of D;
    applying the periodic signal to a first input of a state holding logic element having at least two inputs and an output, the state holding logic element having a first delay;
    providing an inverted output of the state holding logic element to a second one of the at least two inputs of the state holding logic element through a delay element having a second delay, wherein an output duty cycle is different than the unbounded duty cycle on the first input;
    wherein a sum of the first delay plus the second delay is set to less than half of T; and
    bounding the periodic signal wherein a second transition on the output relative to a first transition on the output is temporally separated by about the delay of the delay element plus the delay of the state holding logic element.

13. The method of claim 12 wherein the state holding logic element comprises a C-element.

14. The method of claim 13 wherein the C-element is selected from the group consisting of a one-stage C-element and a two-stage C-element.

15. The method of claim 12 wherein the inverting delay element comprises at least one inverter.

16. The method of claim 12 wherein the inverting delay element has an adjustable delay.

17. The method of claim 12 wherein the state holding logic element comprises a C-element with differential inputs.

18. The method of claim 17 wherein the C-element has a differential output.

19. The method of claim 12 wherein the sum of the first delay plus the second delay is about 48% of T, and wherein D is bound such that:
    $100\% * (\text{first delay} + \text{second delay})/T < D < 100\% * (T - \text{first delay} - \text{second delay})/T$.

* * * * *